(12) United States Patent
Nozawa et al.

(10) Patent No.: US 7,105,449 B1
(45) Date of Patent: Sep. 12, 2006

(54) METHOD FOR CLEANING SUBSTRATE AND METHOD FOR PRODUCING SEMICONDUCTOR DEVICE

(75) Inventors: Katsuya Nozawa, Osaka (JP); Minoru Kubo, Nabari (JP); Tohru Saitoh, Settsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 973 days.

(21) Appl. No.: 10/111,599

(22) PCT Filed: Oct. 27, 2000

(86) PCT No.: PCT/JP00/07534

§ 371 (c)(1),
(2), (4) Date: Apr. 26, 2002

(87) PCT Pub. No.: WO01/33618

PCT Pub. Date: May 10, 2001

(30) Foreign Application Priority Data

Oct. 29, 1999 (JP) .................................. 11-309284

(51) Int. Cl.
  *H01L 21/302* (2006.01)
(52) U.S. Cl. .................... 438/691; 438/695; 438/689; 438/715
(58) Field of Classification Search .................. None
  See application file for complete search history.

(56) References Cited

U.S. PATENT DOCUMENTS 4,452,642 A * 6/1984 Dietz et al. .................... 134/1
5,821,158 A   10/1998 Shishiguchi
6,121,117 A * 9/2000 Sato et al. .................... 438/459
6,143,128 A * 11/2000 Ameen et al. .......... 156/345.24
6,494,959 B1 * 12/2002 Samoilov et al. .............. 134/2

FOREIGN PATENT DOCUMENTS

| JP | 1-158720 | 6/1989 |
| JP | 3-150295 | 6/1991 |
| JP | 5-144751 | 6/1993 |
| JP | 6-69195 | 3/1994 |
| JP | 8-83769 | 3/1996 |
| JP | 9-12397 | 1/1997 |
| JP | 10-242059 | 9/1998 |
| JP | 11-162853 | 6/1999 |

* cited by examiner

Primary Examiner—Thao P. Le
(74) Attorney, Agent, or Firm—McDermott Will & Emery LLP

(57) ABSTRACT

A thermal cleaning of a substrate that has been subjected to wet cleaning is carried out under a high vacuum atmosphere to remove an oxide film remaining on the substrate. Thereafter, a thermal cleaning is carried out under a hydrogen atmosphere to remove contamination such as carbon or the like. At this time, the oxide film has already been removed and therefore contamination is effectively removed by a relatively low temperature and short duration thermal cleaning. Thus, problems such as the degradation of the profile of the impurity concentration in the impurity diffusion layer which has been formed over the substrate are prevented.

11 Claims, 11 Drawing Sheets

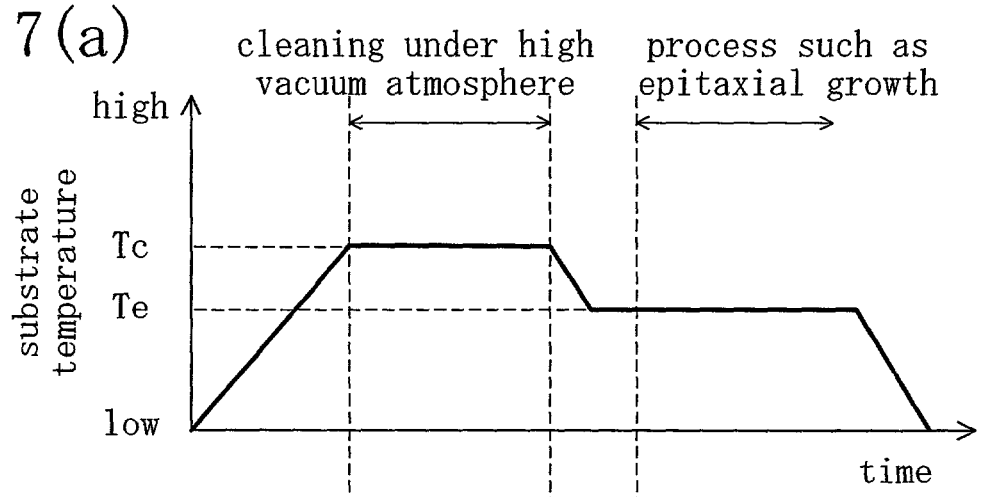
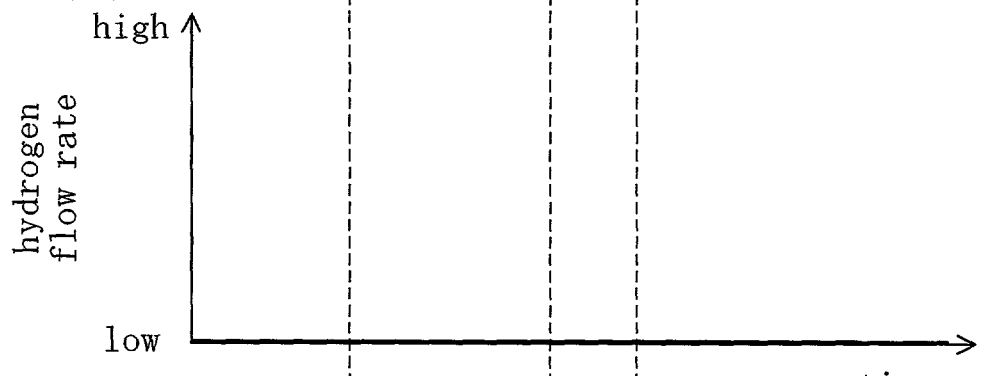
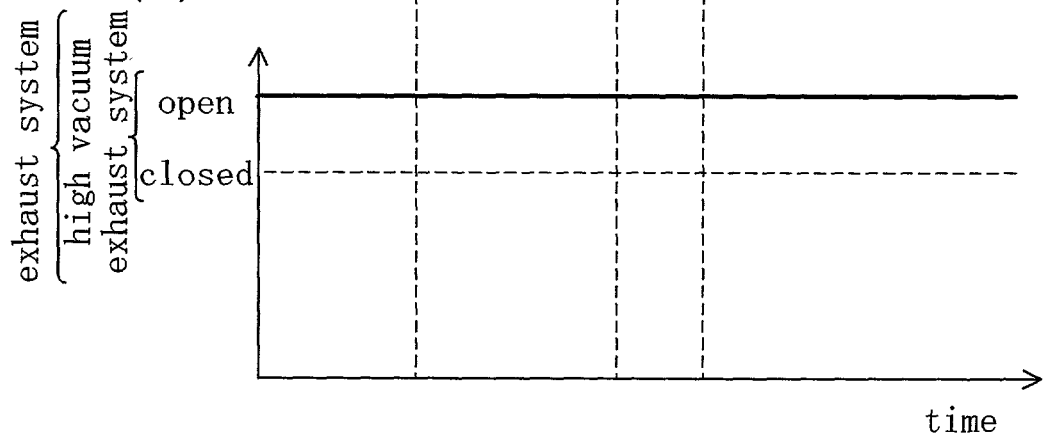

US 7,105,449 B1

METHOD FOR CLEANING SUBSTRATE AND METHOD FOR PRODUCING SEMICONDUCTOR DEVICE

TECHNICAL FIELD

The present invention relates to a method for cleaning a substrate surface, and more particularly, to a method for cleaning a substrate prior to the epitaxial growth using a silicon substrate.

BACKGROUND ART

In recent years, epitaxial growth techniques, in which another crystal is grown on a crystalline substrate, such as a silicon substrate, to have a structure that corresponds to the crystal lattice of the substrate, have been indispensable in the processes for high performance devices such as heterobipolar transistors and elevated source/drain CMOS devices. If contamination exists on the topmost surface of the substrate when carrying out epitaxial growth, the contamination acts as seeds and crystal defects are generated in the epitaxially grown another crystal. Even if the density of the generated crystal defects is not very large, the contamination buried in the crystals adversely affects the characteristics of the device that uses the crystals. For these reasons, in order to produce a high performance device using an epitaxial growth technique, a cleaning in which contamination is removed from the surface of the crystal layer has to be performed prior to the start of the epitaxial growth process.

The cleaning is generally accomplished by means of a washing step, which is carried out outside the crystal growing apparatus, and a thermal cleaning, which is carried out inside the crystal growing apparatus. The washing step is carried out by treating the substrate with chemical solutions, such as acids and hydrogen peroxide, the purpose of which is to remove most of the contamination attached onto the substrate surface. Unlike other processes in the manufacturing steps for a semiconductor device, the cleanliness of a substrate surface that is required for the epitaxial growth process is very high. Thus, the purpose of the thermal cleaning carried out in the chamber is to remove the contamination that cannot be removed by the chemical washing step and to remove the oxide film formed due to reaction of the semiconductor, which composes the substrate with oxygen in the atmosphere subsequent to the chemical washing step or the contamination that has reattached to the substrate surface.

This thermal cleaning is carried out by heating the substrate under a specified atmosphere while the substrate is retained in a chamber. Also, a hydrogen atmosphere or a high vacuum atmosphere is used as an atmosphere in which the thermal cleaning can be carried out.

FIGS. 6(a), 6(b), and 6(c) are timing charts respectively showing the changes over time of wafer temperature, hydrogen flow rate, and open/close operation of an exhaust system during a conventional process including thermal cleaning of a substrate (wafer) under a low-pressure hydrogen atmosphere and epitaxial growth. In this atmosphere, the state of the atmosphere in the chamber is in a viscous flow region since the pressure in the chamber is relatively high, and the transport of gas is in a condition that can be represented in terms of fluid dynamics, in which interaction between the molecules is presumed. As shown in FIG. 6(a), for the cleaning under a hydrogen atmosphere, a thermal cleaning is performed under a pressure of several hundred to several thousand Pa (several Torrs to several ten Torrs) by heating a wafer to a wafer temperature Tc of between 850° C. and 900° C. and supplying hydrogen to the chamber at several liter/min. Thereafter, the temperature in the chamber is reduced to the temperature Te (about 550° C. in the case of epitaxial growth) for a subsequent treatment, and a treatment such as epitaxial growth is carried out. During that time, as shown in FIGS. 6(b) and 6(c), the exhaust system is kept open and a constant hydrogen flow rate Hfl is maintained. Thus, in the case of the thermal cleaning of a wafer under a hydrogen atmosphere, it is necessary that the wafer temperature be about 850° C. or higher in order to complete the thermal cleaning within a treatment time of several minutes.

FIGS. 7(a), 7(b), and 7(c) are timing charts respectively showing the changes over time of wafer temperature, hydrogen flow rate, and open/close operation of an exhaust system during a conventional process including thermal cleaning of a substrate (wafer) under a high vacuum atmosphere and epitaxial growth. As shown in FIG. 7(a), the thermal cleaning under a high vacuum atmosphere is usually carried out by heating the wafer to a wafer temperature Tc of between about 700° C. and 750° C. Thereafter, the temperature in the chamber is reduced to the temperature Te (about 550° C. in the case of epitaxial growth) for a subsequent treatment, and a treatment such as epitaxial growth is carried out. During that time, as shown in FIGS. 7(b) and 7(c), the high vacuum exhaust system is kept open and the hydrogen flow rate Hfl is maintained at 0, that is, hydrogen is not supplied. Thus, in the case of employing a high vacuum, generally no gas is introduced into the chamber during the thermal cleaning, but a small amount of several sccm per minute of disilane, hydrogen, or the like may be introduced. In this atmosphere, since the introduced amount of gas is small, the pressure range inside the chamber is $10^{-2}$ to $10^{-8}$ Pa ($10^{-4}$ to $10^{-10}$ Torr), which is very low. In this high vacuum atmosphere, the gas transport is in a so-called molecular flow region, in which there is almost no interaction between molecules, and in this state there is also little interaction between gas molecules. In this case, the wafer temperature Tc may be about 550° C. (approximately the same as the growth temperature).

In the thermal cleaning method as described above, the types of atmospheres are selected according to the types of exhaust systems of the apparatus used for a treatment subsequent to the thermal cleaning, because the pressure range in the respective atmospheres varies greatly. Generally, thermal cleaning under a hydrogen atmosphere is used as a pretreatment for a low pressure chemical vapor deposition method (LP-CVD method), while the thermal cleaning under a high vacuum atmosphere is used as a pretreatment for an ultrahigh vacuum chemical vapor deposition method (UHV-CVD method) and for a molecular beam epitaxy method (MBE method) using a solid source.

FIGS. 8(a), 8(b), and 8(c) are timing charts respectively showing the changes over time of wafer temperature, hydrogen flow rate, and open/close operation of an exhaust system during a conventional process reported in reference (K. Oda et al., Journal of Electrochemical Society, Vol. 143, No. 7, p. 2361, 1966), which includes thermal cleaning under a high vacuum atmosphere and epitaxial growth. In this example, as shown in FIGS. 8(a) and 8(b), a thermal cleaning is performed under a pressure of several hundred to several thousand Pa (several Torrs to several ten Torrs) by heating a wafer to a wafer temperature Tc between 850° C. and 900° C. under a hydrogen atmosphere and supplying hydrogen into the chamber at several liter/min. Thereafter, an epitaxial growth process is performed under a high vacuum atmosphere. The apparatus is equipped with a high vacuum exhaust system and a low vacuum exhaust system, and as shown in FIG. 8(c), during the thermal cleaning, the high vacuum exhaust system is closed while the low vacuum exhaust system is opened, and during the epitaxial growth, the low vacuum exhaust system is closed while the high vacuum exhaust system is opened. In this method, a hydrogen atmosphere of a viscous flow region is used as an ambient within the chamber only during the thermal cleaning. However, in the case of this method, the condition of the atmosphere in the chamber is always in a viscous flow region from the start of the heating until the completion of the thermal cleaning, and after the thermal cleaning has completed, the inside of the chamber is changed over to an ultrahigh vacuum condition to start crystal growth. Thus, as a thermal cleaning method, this method is not different from the wafer cleaning treatment under a hydrogen atmosphere shown in FIG. 1.

Problems to be Solved

In a manufacturing process of a BiCMOS device, in which a CMOS device and a bipolar transistor are provided on a common wafer, the following process is employed. A BiCMOS device, which utilizes a Si/SiGe heterojunction, is known as being capable of high speed operation and having a high degree of integration at low cost. In the manufacturing process, it is required to first form the elements for the CMOS device on the wafer and then the elements for the bipolar transistor. This is because the SiGe layer that forms the base layer of the bipolar transistor has low heat resistance, and therefore, if the bipolar transistor is formed in advance, the manufacturing process for the CMOS device is very much constrained. On the other hand, when the CMOS device is formed in advance and a high temperature treatment at about 850° C. to 900° C. is carried out in the formation of the bipolar transistor, there is a risk that the impurities contained in the impurity diffusion layer of the CMOS device may diffuse and consequently a desired impurity concentration profile may not be obtained. This becomes a cause of degradation of device characteristic. In view of this, in processing a BiCMOS that incorporates a Si/SiGe heterobipolar transistor, the thermal cleaning prior to the formation of a SiGe layer is usually carried out under a high vacuum atmosphere.

However, the present inventors have discovered that, in the course of examining causes of defects in electric characteristics of BiCMOS devices, there are many defective products even in the devices that use SiGe films formed by carrying out a thermal cleaning treatment under a high vacuum atmosphere and thereafter an epitaxial growth method. It is also reported in the reference mentioned above that, when the amount of remaining C is large, device characteristics are degraded.

DISCLOSURE OF THE INVENTION

An object of the present invention is to establish a thermal cleaning method that sufficiently achieves two functions, removal of oxide films and removal of contamination, that are supposed to be achieved by thermal cleaning under conditions that do not cause device characteristic degradation leading to problems in practice, and to apply the thermal cleaning method to manufacturing processes for BiCMOS devices that incorporate heterobipolar transistors.

In order to solve the foregoing problems, the applicants have studied the conditions that can achieve the two important functions in conventional thermal cleaning treatments, namely removal of oxide films and removal of contamination, and consequently have discovered the followings.

FIGS. 4(a) and 4(b) show the results of a study performed by the applicants in which decomposition conditions of oxide films resulting from thermal cleaning under an ultrahigh vacuum atmosphere and under a hydrogen atmosphere are examined by spectroscopic ellipsometry. In the figures, the horizontal axis represents time (sec) and the vertical axis represents A in spectroscopic ellipsometry. For the oxide film, a thin, so-called chemical oxide film is used which is formed by an ammonia-hydrogen peroxide mixed solution treatment, and the heating temperatures in both cases are 850° C. The thermal cleaning under a hydrogen atmosphere is carried out under conditions in which the pressure is about 10 Torr (approximately equal to 1333 Pa) and the hydrogen flow rate is 1 liter/min. As shown in FIG. 4(a), in a high vacuum atmosphere, the interval between time $t_{st}$ at which the 850° C. heating treatment is started and time $t_{en}$ at which removal of an oxide film is completed is about 1 minute. In contrast, as shown in FIG. 4(b), it was demonstrated that in a hydrogen atmosphere, the interval between time $t_{st}$ at which the 850° C. heating treatment is started and time $t_{en}$ at which removal of an oxide film is completed is 8 min or longer. This indicates that the thermal cleaning under a high vacuum atmosphere is advantageous for removing an oxide film formed by chemical cleaning as the required treatment time is short, while the thermal cleaning under a hydrogen atmosphere necessitates the conditions of a high temperature and a longer treatment time. This is presumed to be because desorption of SiO, which is one of the elementary processes in the decomposition process of oxide films, is inhibited by the viscous flow of hydrogen. In this experiment, in order to compare the oxide film removal functions between the thermal cleaning under a hydrogen atmosphere and the thermal cleaning under a vacuum atmosphere, the substrates are heated to 850° C. in both cases, but it is known that in the case of a thermal cleaning under a high vacuum atmosphere, oxide films can be removed within a relatively short time if the temperature is 550° C. or higher. It seems that the reason why the thermal cleaning under a hydrogen atmosphere requires a higher temperature than the thermal cleaning under a high vacuum atmosphere is that, under a hydrogen atmosphere, the decomposition process of oxide films takes place slower.

FIG. 5 shows the results of a study carried out by the applicants in which the concentrations of the oxygen and carbon that have remained on substrate surfaces subsequent to the removal of the oxide film under an ultrahigh vacuum atmosphere and under a hydrogen atmosphere are examined by secondary ion mass spectrometry (SIMS). In the figure, the horizontal axis represents temperature (° C.) in thermal cleaning and the vertical axis represents the detected concentrations ($cm^{-2}$) of oxygen and carbon on the substrate surfaces. The thermal cleaning under a hydrogen atmosphere is carried out by an LP-CVD method in which $H_2$ gas is supplied at a pressure of 80 Torr (about $10 \times 10^4$ Pa) and a flow rate of 20 liter/min., and the treatment time is 2 minutes in the case of 900° C., 10 minutes in the case of 800° C., or 20 minutes in the case of 750° C. The thermal cleaning under a high vacuum is performed for 5 minutes in all cases.

As seen from FIG. 5, no carbon (C) is detected in the substrates subjected to a thermal cleaning under a hydrogen atmosphere, even when the substrate temperatures are between 750° C. and 800° C. Thus, it is understood that a thermal cleaning under a hydrogen atmosphere can reduce carbon in a region near the interface between the oxide film and the substrate to a level lower than a detectable limit even at a lower substrate temperature than a normally adopted substrate temperature of 850° C. to 900° C. Under the conditions in which the data shown in FIG. 5 are obtained, the treatment time in the case of 750° C. is 10 minutes, but even with a treatment time shorter than this, the remaining carbon on a substrate surface can be reduced to a degree such that device characteristics that do not cause problems in practical use are obtained. On the other hand, it was confirmed that in the cases of thermal cleaning under a high vacuum atmosphere, contamination such as carbon tends to remain at the interface between the substrate and the epitaxially grown crystal layer.

A method for cleaning a substrate according to the present invention includes a step (a) of heating a substrate in a vacuum atmosphere for a given time, and a step (b) of heating the substrate in a hydrogen atmosphere for a given time after step (a) has been completed.

According to this method, the thermal cleaning under a vacuum atmosphere removes an oxide film formed on the substrate by a chemical washing of the substrate or the like, and thereafter, the thermal cleaning under a hydrogen atmosphere removes contamination (carbon, boron, and the like). Thus, when the thermal cleaning under a hydrogen atmosphere is carried out, the oxide film has already been removed almost completely, and therefore, the thermal cleaning can be carried out under sufficient temperature and time conditions for removing most of the contamination only. Consequently, in semiconductor devices formed using a thermal cleaning process, degradation of impurity concentration profiles and occurrence of pattern deformation and the like can be suppressed.

Such advantageous effects have not been achieved because, to date, no technique has been established to respectively display the two functions, namely removal of oxide films and removal of contamination. In other words, conventional thermal cleaning techniques under hydrogen atmospheres have attempted to attain both the removal of oxide films and removal of contamination with only one kind of treatment and therefore have necessitated high temperature and long treatment time. Meanwhile, in conventional thermal cleaning techniques under a vacuum atmosphere, the fact that the thermal cleaning under a vacuum atmosphere itself cannot achieve the function of contamination removal is not sufficiently taken into consideration. For this reason, depending on the kind of semiconductor devices, such as BiCMOS devices incorporating heterobipolar transistors, there is a risk that when a conventional thermal cleaning method is used for the manufacturing process thereof, sufficiently good characteristics cannot not attained.

In contrast, in the method for cleaning a substrate according to the present invention, the function of oxide film removal is mainly achieved by the thermal cleaning under a vacuum atmosphere, and the function of contamination removal is mainly achieved by the thermal cleaning under a hydrogen atmosphere. In other words, the two functions that are supposed to be achieved by thermal cleaning are separately carried out, whereby thermal cleaning can be performed under conditions in which degradation in characteristics of semiconductor devices are suppressed.

It is preferable that the above-mentioned step (a) is carried out under an ultrahigh vacuum atmosphere in which the pressure is lower than $1 \times 10^{-5}$ Pa.

When the above-mentioned step (b) is carried out within a temperature range of between 750° C. and 850° C., degradation in characteristics of a semiconductor formed on the substrate is more effectively suppressed.

The above-mentioned step (b) may be carried out under conditions in which the highest temperature is in the range of between 800° C. and 900° C. and the time during which the highest temperature is maintained is 30 seconds or less.

The above-mentioned steps (a) and (b) may be carried out as a pretreatment prior to a process of epitaxially growing a crystal layer on the substrate from which an oxide film has been removed, or as a pretreatment prior to a process of forming a thermally-oxidized film over a substrate.

When the above-mentioned steps (a) and (b) are carried out on a substrate having an impurity diffusion layer formed thereon, degradation in the impurity concentration profile of the impurity diffusion layer is suppressed while the oxide films and remaining contaminations that adversely affect device characteristics are effectively removed.

According to the present invention, a method for producing a semiconductor device, which includes a process of epitaxially growing a second semiconductor layer on a first semiconductor layer of a substrate, includes a step (a) of putting the substrate in a vacuum atmosphere to remove heating for a given time, subsequent to the formation of the first semiconductor layer and prior to the formation of the second semiconductor layer, and a step (b) of heating the substrate in a hydrogen atmosphere for a given time, after step (a) has been completed.

According to this method, the effects of the removal of oxide films and removal of contamination are obtained by carrying out by thermal cleanings in different atmospheres. As a result, a semiconductor device is formed which has a good impurity concentration profile and is free from pattern deformation as well as degradation in device characteristics caused by the presence of contamination.

The semiconductor device may comprise a MIS device and a Si/SiGe heterobipolar transistor provided on the substrate, and steps (a) and (b) may be carried out after the process of forming the diffusion layer of the MIS device and before the process of epitaxially growing the SiGe layer of the Si/SiGe heterobipolar transistor, whereby a manufacturing method for a semiconductor device is obtained which is particularly suitable for a semiconductor device having a Si/SiGe heterobipolar transistor.

When step (a) and step (b) are carried out in separate chambers, two kinds of thermal cleaning can be simultaneously carried out for two substrates, hence a manufacturing method for a semiconductor device that is advantageous for mass production can be achieved.

BRIEF DESCRIPTION OF DRAWINGS

FIGS. 7(a), 7(b), and 7(c) are timing charts respectively showing the changes over time in wafer temperature, hydrogen flow rate, and open/close operation of the exhaust system during a conventional treatment including a thermal cleaning of the wafer under a high vacuum atmosphere.

BEST MODE FOR CARRYING OUT THE INVENTION

Embodiment 1

In the present embodiment, a case is explained in which a wafer having a silicon layer is used as a substrate and thermal cleaning is carried out as a pretreatment prior to forming on the silicon layer another silicon layer, a SiGe layer, a SiGeC layer, or the like.

Figure 1A:
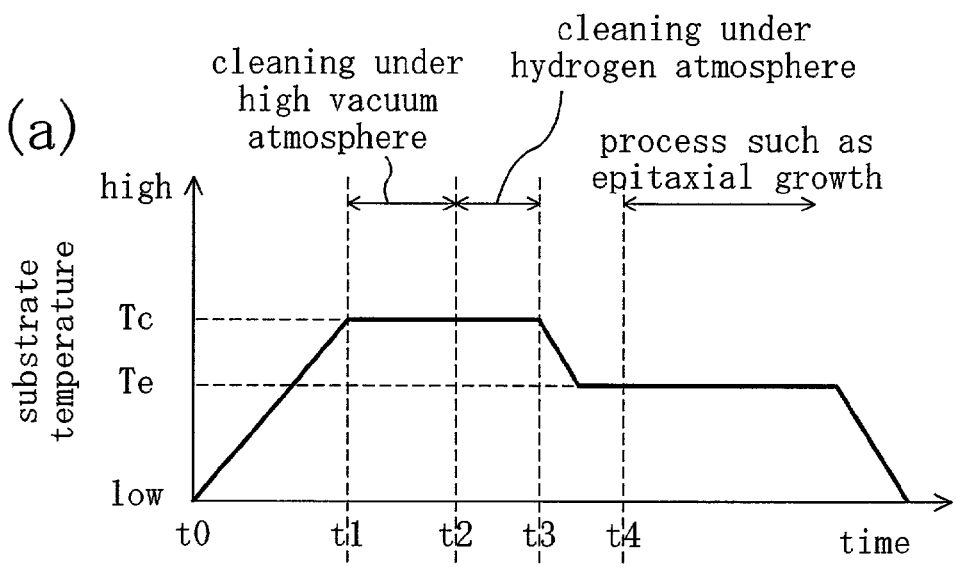
FIGS. 1(a), 1(b), and 1(c) are timing charts respectively showing the changes over time in wafer temperature, hydrogen flow rate, and open/close operation of an exhaust system during the thermal cleaning and the epitaxial growth process according to an embodiment of the invention.
Figure 1B:
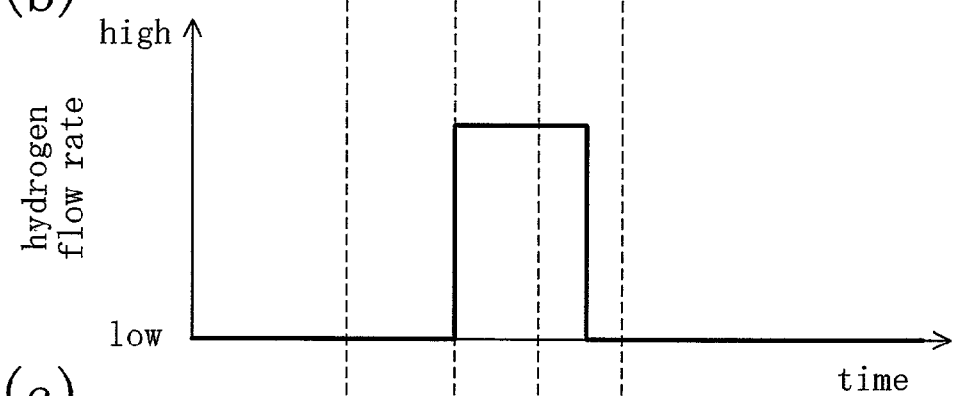
Figure 1C:
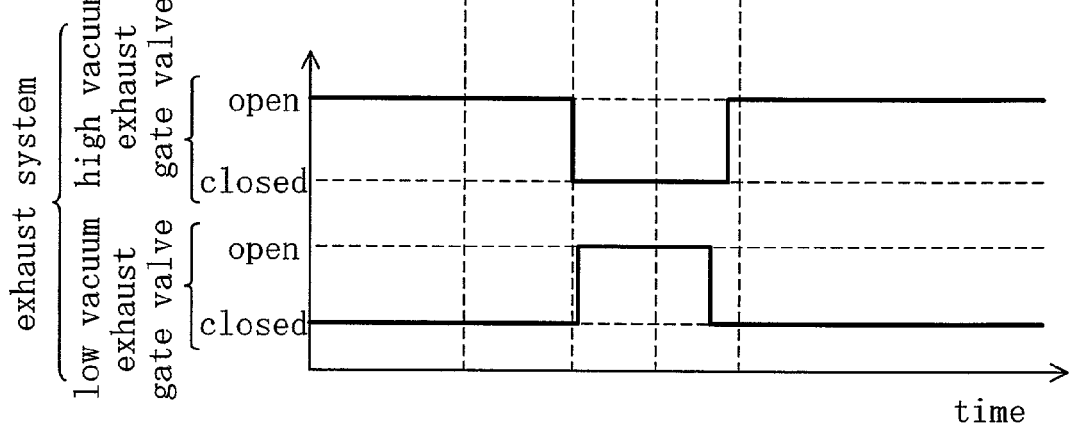
Figure 2:
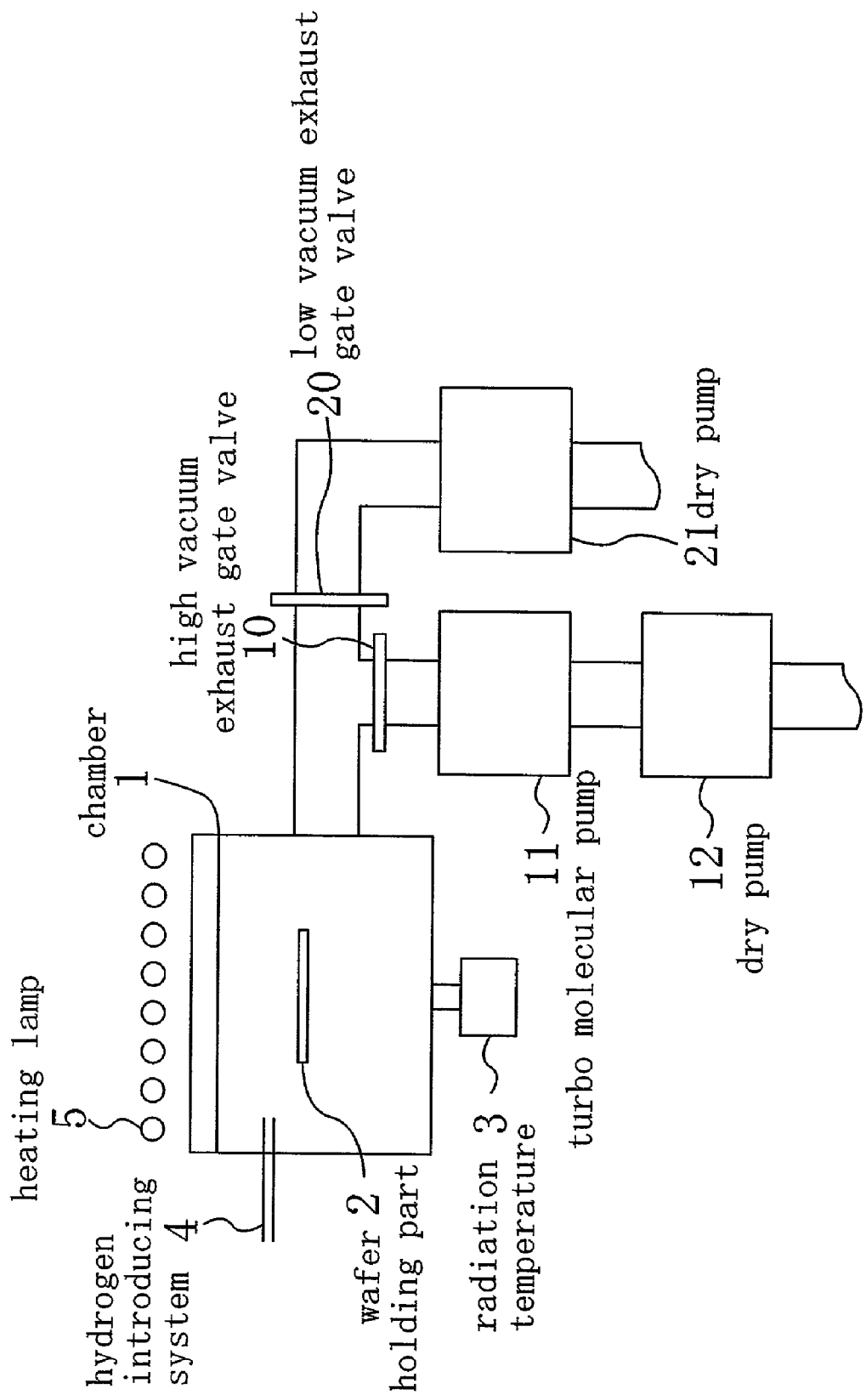
FIG. 2 is a diagram schematically showing the configuration of a crystal growing apparatus that is used in Embodiment 1.

FIGS. 1(a), 1(b), and 1(c) are timing charts respectively showing the changes over time in wafer temperature, hydrogen flow rate, and open/close operation of an exhaust system during the thermal cleaning and the epitaxial growth process according to the present embodiment. FIG. 2 is a diagram schematically showing the configuration of a crystal growing apparatus that is used in the present embodiment.

In the present embodiment, the following treatments are performed on a wafer before a thermal cleaning of the wafer is carried out in the crystal growing apparatus. Before the wafer is introduced into the chamber of the crystal growing apparatus, the silicon layer of the wafer is subjected to a so-called wet cleaning, using chemicals such as ammonia hydrogen peroxide aqueous solution, hydrogen peroxide sulfate, and the like, to reduce contamination on the surface of the wafer, i.e., the surface of the silicon layer. For the wet cleaning, various methods other than the method described in the present embodiment may be employed insofar as the removal of contamination from the wafer surface is sufficiently carried out. Examples include a so-called RCA cleaning method, which uses an acid and an alkali, and a cleaning method using ozone water. In the final stage of this wet cleaning, the wafer is treated with a chemical solution containing hydrofluoric acid, such as dilute hydrofluoric acid, to remove the oxide film on the surface of the silicon layer, so that most of the bonds of the silicon atoms that are exposed on the surface of the silicon layer are terminated by hydrogen. Next, the wafer, the surface of the silicon layer on which silicon atoms have been terminated by hydrogen, is washed with water and thereafter dried with a spin dryer or with isopropyl alcohol. After this drying step is completed, patches of the oxide film are present on the silicon layer. This is because the oxide film has not been removed by the hydrogen termination or a reaction with the atmosphere has taken place again after the termination.

Next, the wafer, which has been subjected to the wet cleaning and the subsequent drying treatment, is introduced into a crystal growing apparatus. In the present embodiment, since the inside of the chamber needs to be altered between a high vacuum condition and a low vacuum condition, the crystal growing apparatus needs to have a configuration which is compatible therewith.

As shown in FIG. 2, the crystal growing apparatus of the present embodiment comprises a chamber 1, a wafer holding part 2 that is provided inside the chamber 1 and serves to hold a wafer to be treated, a radiation pyrometer 3 for measuring wafer temperature, a hydrogen introduction system 4 for supplying hydrogen gas into the chamber 1, and a heating lamp 5 for heating a wafer to be treated. An exhaust pipe branches into two directions, and one of the branched exhaust pipes is provided with a high vacuum exhaust gate valve 10, a turbo molecular pump 11, and a dry pump 12, which serve as a high vacuum exhaust system. The other branched exhaust pipe is provided with a low vacuum exhaust gate valve 20 and a dry pump 21, which serve as a low vacuum exhaust system.

In order to obtain a high vacuum condition in the chamber 1, the vacuum in the chamber 1 needs to be sufficiently higher than about $1\times10^{-5}$ Pa, and therefore, it is necessary that the high vacuum exhaust system have a vacuum pump that is suitable for use in high vacuum, such as the turbo molecular pump 11, in addition to the dry pump 12. Also, the use of the dry pump 21 or the like is necessary in a hydrogen atmosphere, which is a low vacuum region, since a large amount of gas needs to be evacuated from the chamber 1. In addition, when the thermal cleaning under a high vacuum atmosphere and the thermal cleaning under a hydrogen atmosphere are carried out in one chamber, as in the case of the present embodiment, the high vacuum exhaust gate valve 10 and the low vacuum exhaust gate valve 20 are required in order to quickly switch the exhaust system of the chamber 1 between the high vacuum exhaust system and the low vacuum exhaust system. It should be noted that turbo molecular pumps that are usable from a low vacuum range to a high vacuum range have become available in recent years, and when such a turbo molecular pump is employed, it is possible to integrate the low vacuum exhaust system and the high vacuum exhaust system into one system. If this is the case, it is necessary that a low vacuum pump, such as a dry pump, be connected to the downstream side of a high vacuum pump, such as a turbo molecular pump, and the downstream exhaust pump 12 may be used as a pump for discharging hydrogen during the thermal cleaning under a hydrogen atmosphere. It is required, however, that a bypass line and a gate valve for the changeover thereto are connected to the exhaust pipe so that, during the cleaning under a hydrogen atmosphere, which uses only the low vacuum pump, a pump exclusively used for high vacuum, such as the turbo molecular pump, is bypassed and the chamber is evacuated by the dry pump.

In addition, because heating a wafer to be treated is necessary in a thermal cleaning, a wafer heating mechanism such as the heating lamp 5 and a wafer temperature measuring means such as the radiation pyrometer 3 are required. Instead of using a radiation pyrometer, the temperature measurement for a wafer to be treated may also be carried out using a thermocouple.

As will be discussed later, it is not necessary that the removal of an oxide film in a high vacuum atmosphere and the removal of contamination in a hydrogen atmosphere be carried out in the same chamber. As will be explained in Embodiment 2, it is possible to employ a configuration such that the removal of an oxide film in a high vacuum atmosphere and the removal of contamination in a hydrogen atmosphere are carried out in different chambers and the wafer is transferred between these chambers in a vacuum.

In the following, the procedure according to the present embodiment, in which the oxide film removal and the cleaning under a hydrogen atmosphere are carried out in the same chamber, is explained with reference to FIGS. 1(*a*) through 1(*c*) and 2.

First, in a crystal growing apparatus as shown in FIG. 2, using the high vacuum exhaust system, the chamber 1 is evacuated until the vacuum reaches about $10^{-6}$ to $10^{-8}$ Pa (approximately $10^{-6}$ to $10^{-8}$ Torr). At the timing t0 shown in FIG. 1(*a*), the vacuum in the chamber 1 is sufficiently high, and at this timing to, heating of the wafer is started to remove the oxide film. The temperature Tc that is required for the removal of an oxide film is normally about between 600° C. and 800° C., although it also depends on the method for wet cleaning and the atmosphere in which the cleaned wafer is placed. During this oxide film removal treatment, the high vacuum exhaust gate valve 10 is opened without releasing hydrogen, while the low vacuum exhaust gate valve 20 is kept closed, as shown in FIGS. 1(*b*) and 1(*c*). During that time, the chamber 1 is kept in a high vacuum condition, so the treatment time and the treatment temperature necessary for the removal of an oxide film may be the same as those in the case in which the process from the thermal cleaning to the crystal growing is carried out in a high vacuum condition. In other words, a high temperature of 850° C. or higher is unnecessary, unlike the case of the oxide film removal treatment under a hydrogen atmosphere. According to our working examples, an oxide film is almost completely removed by maintaining the wafer temperature Tc at 770° C. for 4 minutes (until timing t2) from the time the wafer temperature Tc reaches about 770° C. (timing t1). Thus, in the present embodiment, under a high vacuum atmosphere, a wafer is heated to a prescribed temperature and the wafer temperature is kept constant until the completion of the removal of the oxide film. It is, however, not essential that the removal of the oxide film be carried out at a constant temperature, and the oxide film can be removed by increasing the wafer temperature to a peak temperature and immediately thereafter decreasing the temperature under a high vacuum atmosphere.

Next, at timing t2, when the removal of the oxide film by thermal cleaning under a high vacuum atmosphere has been completed, the process shifts to a thermal cleaning under hydrogen atmosphere. The timing t2 of this shift is determined according to how much the surface is oxidized in the ongoing process. Specifically, the timing of the shift may be determined by performing experiments in advance, or may be determined by detecting the completion of the removal of the oxide film by an observation means, such as RHEED.

At this moment, as shown in FIGS. 2(*b*) and (*c*), the flow rate of hydrogen is set to, for example, about 1 liter/min, and the high vacuum exhaust gate valve 10 is closed while the low vacuum exhaust gate valve 20 is opened.

It is preferable that the thermal cleaning in a hydrogen atmosphere be carried out with the pressure in the chamber being in the range of 1 Torr (133.3 Pa) to several ten Torr (several thousand Pa), in the viscous flow region. "Viscous flow region" is generally referred to an atmosphere having a pressure of about $1 \times 10^{-1}$ Pa, and this degree of amount of hydrogen is considered necessary when a wafer cleaning effect due to hydrogen is expected.

At the time when the exhaust system is switched from the high vacuum exhaust system to the low vacuum exhaust system by opening and closing the gate valves at timing t2, there is the risk that molecules flow back from the low vacuum exhaust system to the chamber 1 if the inside of the chamber 1 is in a high vacuum condition and the exhaust system is in a low vacuum condition. In view of this, in the present embodiment, introduction of hydrogen into the chamber 1 is started after the high vacuum exhaust gate valve 10 has been closed, and thereafter, the low vacuum exhaust gate valve 20 is opened at the time when the pressure in the chamber 1 exceeds the pressure of the low vacuum exhaust system to start evacuation from the chamber 1. During the changeover of open/close positions of the gate valves 10 and 20, the wafer temperature Tc may be kept at a high temperature (770° C.). Alternatively, it is possible to suspend the heating of wafer temporarily until the wafer is cooled to the temperature most suitable for the open/close operations of the gate valves 10 and 20, then to change the open/close positions of the gate valves 10 and 20, and to reheat the wafer after the changeover operation has been completed.

Then, after the exhaust system for the chamber 1 has been changed to the low vacuum exhaust system, the amount of hydrogen to be introduced and the amount of evacuation by the evacuation system are adjusted until the pressure of the chamber 1 becomes a pressure of approximately from 133 Pa to several thousand Pa (approximately from 1 Torr to several Torrs). The amount of introduced hydrogen that is necessary to adjust the pressure in the chamber 1 to be in this range varies depending on the evacuating performance of the exhaust system, and in the present embodiment, it is about several liters per minute to several ten liters per minute. Generally, at the same pressure, when the treatment is performed with a larger amount of hydrogen, the cleanliness of the wafer is higher, because the contamination removed from the wafer surface by hydrogen is prevented from re-attaching onto the wafer surface. Therefore, it is preferable to supply hydrogen at as large a flow rate as possible within the range in which the pressure in the chamber 1 is maintained at an appropriate level, taking into consideration the supply capacity for hydrogen, the throughput of evacuation, and the like. In addition, in order to prevent regrowth of oxide films, it is preferable that the hydrogen that is introduced into the chamber 1 is hydrogen from which the remaining moisture and oxygen are sufficiently removed by, for example, a purifier that uses a palladium alloy film.

Then, after the thermal cleaning under a hydrogen atmosphere has been performed until timing t3, the wafer temperature Tc is reduced to about 550° C. to 700° C. and the process shifts to the treatment after timing t4, such as an epitaxial growth process.

In the present embodiment, because it is assumed that an epitaxial growth process is carried out after timing t4, the changeover of the gate valves 10 and 20 is carried out between timing t3 and timing t4. Specifically, the low vacuum exhaust gate valve 20 is closed while the high vacuum exhaust gate valve 10 is opened, and the supply of hydrogen into the chamber 1 is halted. After the supply of hydrogen into the chamber 1 has been halted, the evacuation of the chamber 1 using the low vacuum exhaust system is continued and, after the degree of vacuum in the chamber 1 has become so high that the high vacuum exhaust system is not overloaded, the low vacuum exhaust gate valve 20 is closed while the high vacuum exhaust gate valve 10 is opened to bring the inside of the chamber 1 to a high vacuum condition.

Figure 5:
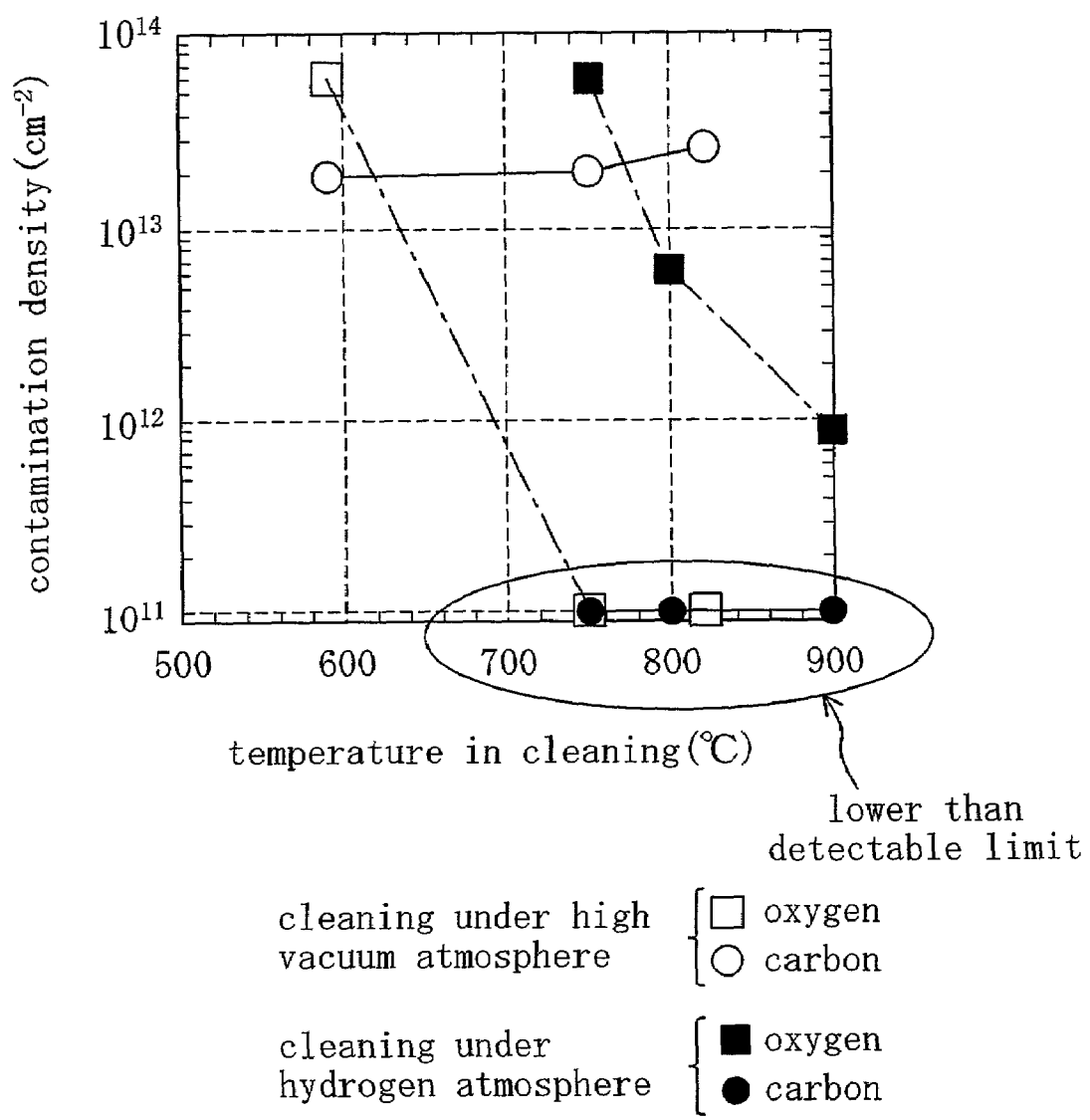
FIG. 5 shows the results of determining by SIMS the concentrations of oxygen and carbon that remain on the substrate surface from which an oxide film has been removed under an ultrahigh vacuum atmosphere and under a hydrogen atmosphere.
Figure 6A:
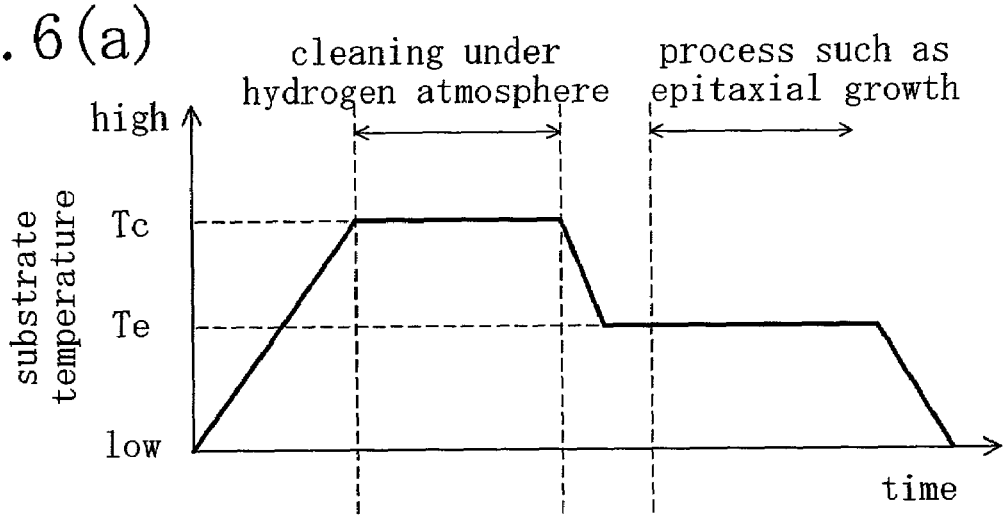
FIGS. 6(a), 6(b), and 6(c) are timing charts respectively showing the changes over time in the wafer temperature, the hydrogen flow rate, and the open/close operation of the exhaust system during a conventional treatment including a thermal cleaning of the wafer under a low pressure hydrogen atmosphere.
Figure 6B:
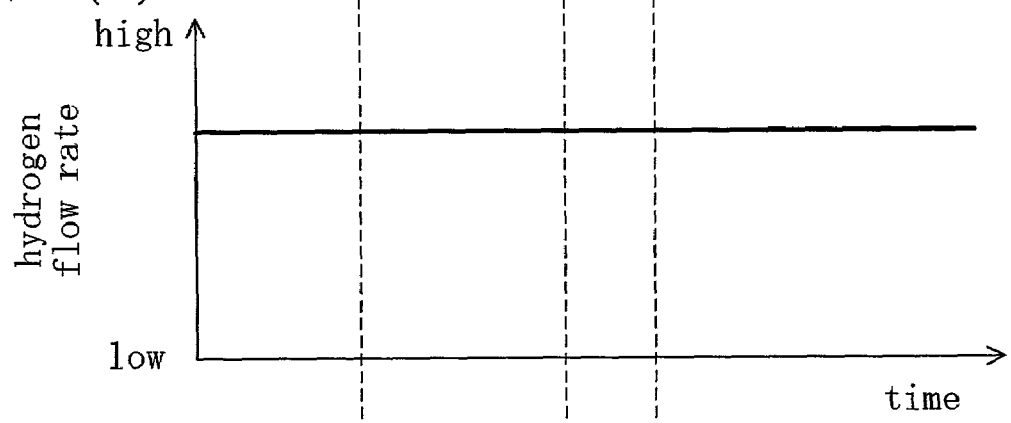
Figure 6C:
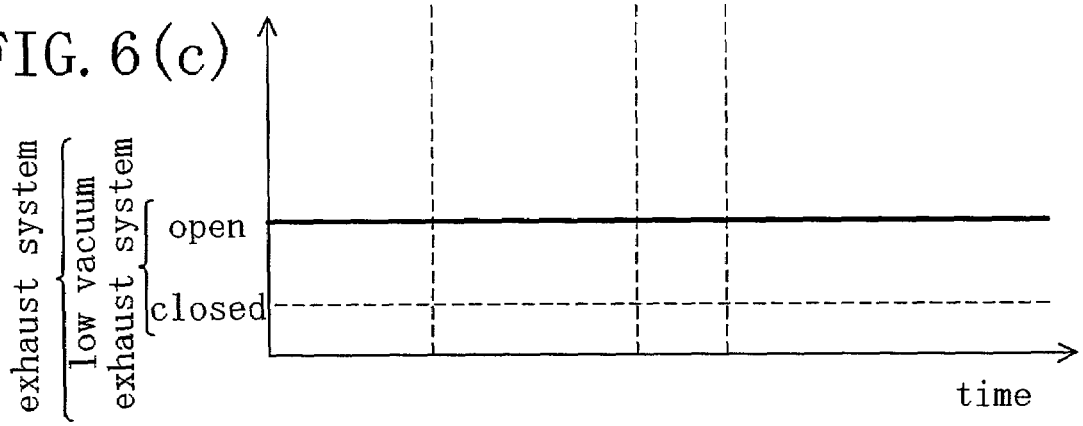
Figure 8A:
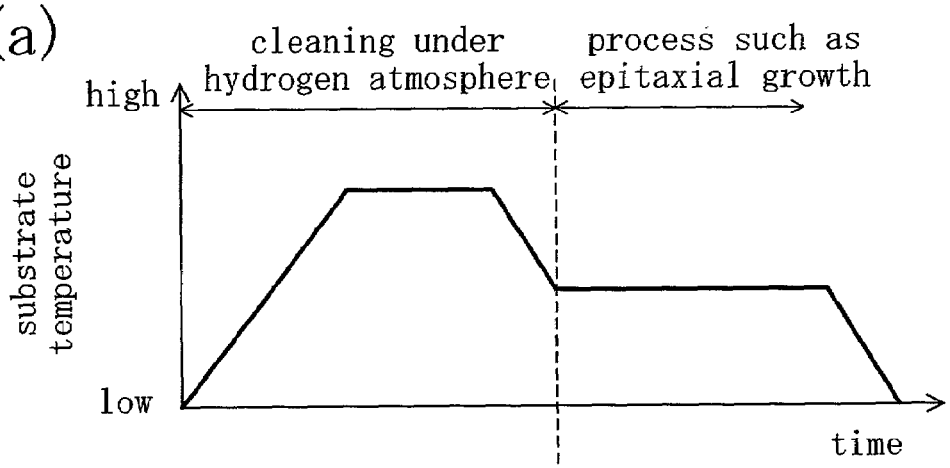
FIGS. 8(a), 8(b), and 8(c) are timing charts respectively showing the changes over time in wafer temperature, hydrogen flow rate, and open/close operation of the exhaust system during a conventional treatment including a thermal cleaning under a high vacuum atmosphere that is reported in the literature.
Figure 8B:
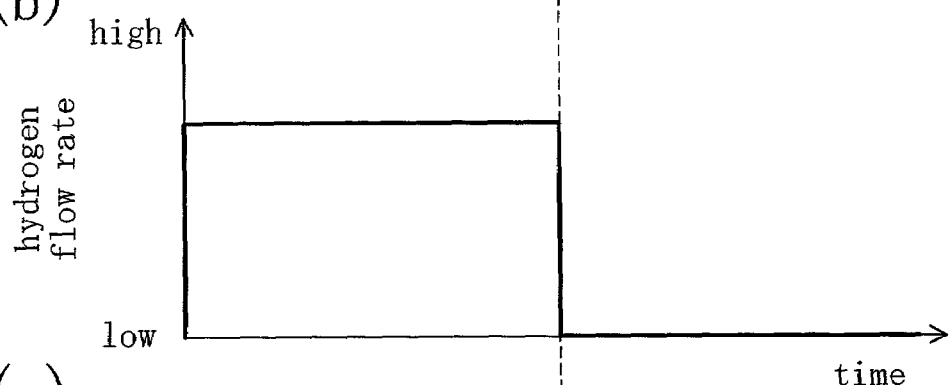
Figure 8C:
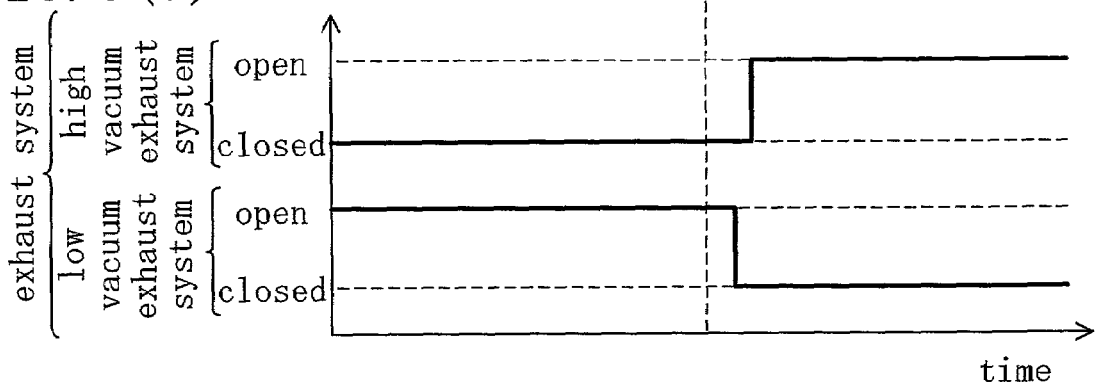

Due to the thermal cleaning under a hydrogen atmosphere from timing t2 to timing t3 as described above, the amount of carbon on the wafer surface is reduced. At this moment, an oxide film, which decomposes slowly under a viscous flow hydrogen atmosphere, has already been removed, and therefore, the contamination removal proceeds quicker than if the whole thermal cleaning is carried out under a hydrogen atmosphere that is in a viscous flow region. Specifically, as seen from the illustration of the data shown in FIG. 5, even when the wafer temperature is 800° C. or lower, the effect is attained such that several minutes of the treatment can remove carbon to a degree that does not cause problems for practical use. Accordingly, it is considered sufficient that the temperature and duration of the thermal cleaning under a hydrogen atmosphere are, for example, about 770° C. and about 5 minutes. As shown in FIG. 5, although the data for the amount of the remaining carbon were not obtained, it is apparent that a certain degree of carbon removal effect can be obtained by the thermal cleaning at 750° C. for several minutes. It should be noted that the wafer temperature in the thermal cleaning under a hydrogen atmosphere may be the same as or higher than the temperature in the thermal cleaning under a high vacuum atmosphere.

It is to be noted that in the thermal cleaning under a hydrogen atmosphere, the higher the wafer temperature Tc is, the quicker the time required for the removal of carbon, but excessive temperatures cause adverse effects such as variation in the impurity concentration profile, deformation of the pattern, and so forth. Therefore, it is preferable that it is carried out under the conditions of 750° C. to 800° C.

Nevertheless, the thermal cleaning under a hydrogen atmosphere may be carried out at a temperature of 800° C. or higher (preferably at 900° C. or lower). In particular, when using heating methods for the activation of ion-injected impurities, such as RTA (annealing in which the holding time of the peak temperature is short) or flash annealing, in which the time during which the peak temperature is maintained is almost 0, heating to a temperature between 800° C. and 900° C. hardly causes practical problems, such as degradation of impurity concentration profiles.

According to the thermal cleaning method for the present embodiment, unlike the methods in which both the removal of an oxide film and the removal of carbon are carried out by only a treatment under a hydrogen atmosphere, as in the case in conventional thermal cleaning methods, the removal of an oxide film and the removal of contaminations such as carbon can be attained without inducing problems such as degradation of impurity concentration profiles of the semiconductor layer in the wafer or deformation of patterns that have already been formed. Moreover, in comparison with conventional thermal cleaning methods under a vacuum atmosphere, contamination, such as carbon, that remains after the removal of the oxide film is effectively removed and consequently a degradation of the device performance caused by the presence of remaining carbon can be suppressed.

In the present embodiment, it is assumed that after the thermal cleaning under a hydrogen atmosphere has been completed (after timing t3), the subsequent epitaxial growth process is carried out by a UHV-CVD method, but in a case where the epitaxial growth process is carried out by an LP-CVD method, the changeover between the gate valves 10 and 20 is not necessary and it is only necessary that the gas to be supplied to the chamber is changed from hydrogen atmosphere to a source gas for crystal growth.

In addition, the present embodiment has described only the removal of carbon as an example of the contamination remaining on the wafer surface, but besides carbon the device performance also can be degraded by boron (b) that remains on the wafer surface. By employing a thermal cleaning as described in the present embodiment, in which the atmosphere in the chamber is separated into a high vacuum atmosphere and a hydrogen atmosphere, contamination with boron or the like can also be effectively removed.

Embodiment 2

The present embodiment describes a case in which a thermal cleaning for removing an oxide film under a vacuum atmosphere and a thermal cleaning for removing contamination under a hydrogen atmosphere are carried out in separate chambers.

Figure 3:
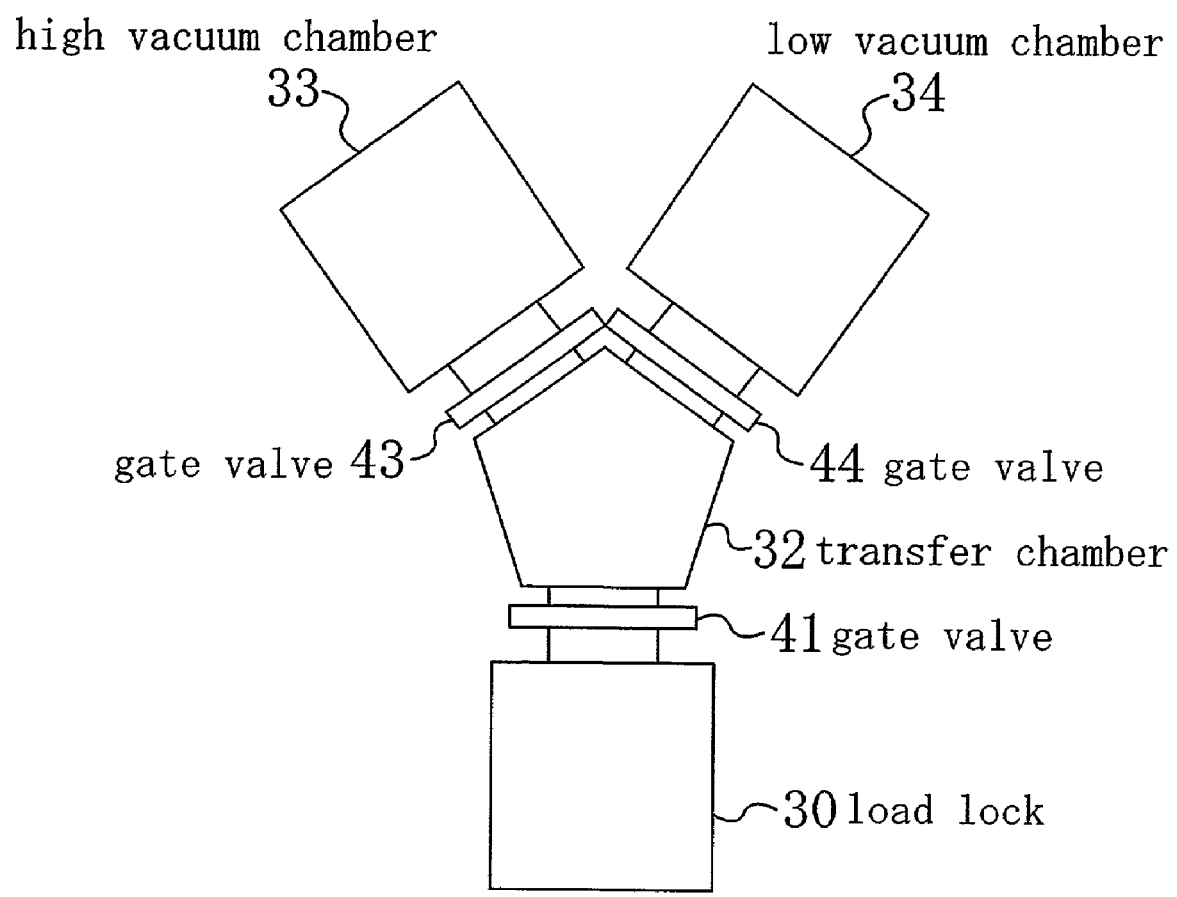
FIG. 3 is a block diagram schematically showing the configuration of a crystal growing apparatus used in Embodiment 2.
Figure 4A:
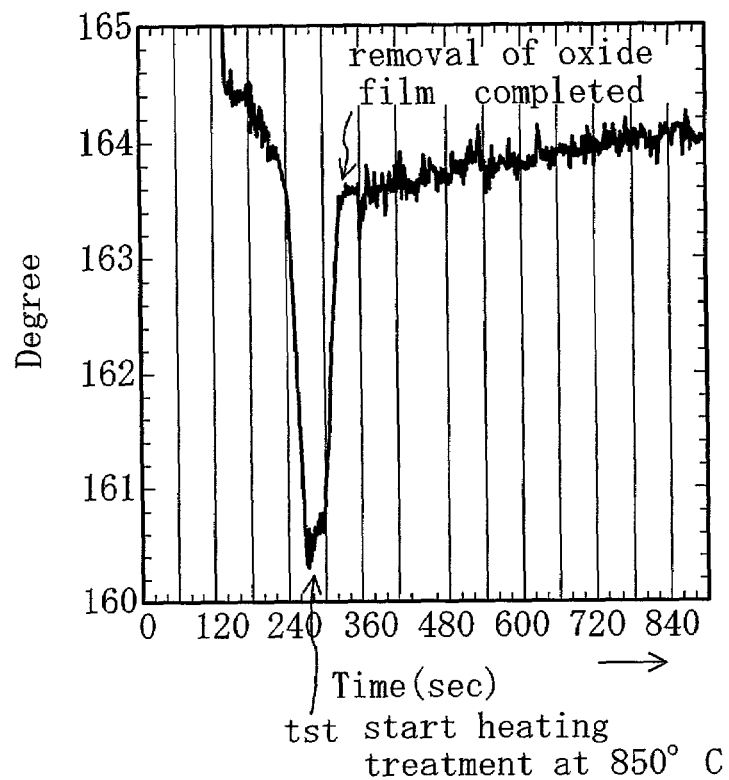
FIGS. 4(a) and 4(b) are graphs showing the results of a study in which decomposition conditions of oxide films resulting from the thermal cleanings under an ultrahigh vacuum atmosphere and under a hydrogen atmosphere are examined by spectroscopic ellipsometry.
Figure 4B:
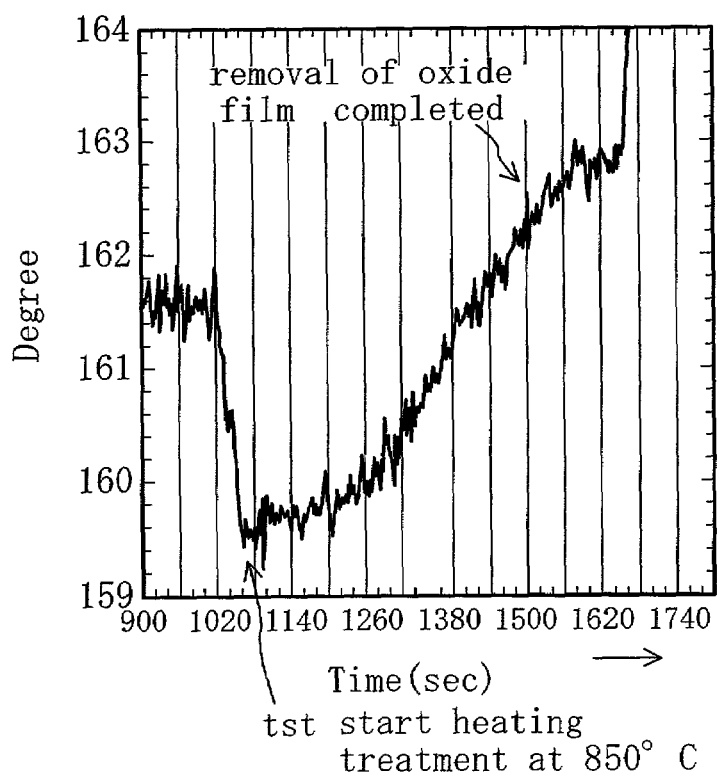

FIG. 3 is a block diagram showing the configuration of a crystal growing apparatus used in the present embodiment. As shown in the figure, the crystal growing apparatus of the present embodiment comprises a load lock 30, which is a place where a wafer is transferred from outside and stored, a transfer chamber 32 for transferring the wafer, a high vacuum chamber 33, a hydrogen atmosphere chamber 34, a gate valve 41 provided between the load lock 30 and the transfer chamber 32, a gate valve 43 provided between the transfer chamber 32 and the high vacuum chamber 33, and a gate valve 44 provided between the transfer chamber 32 and the hydrogen atmosphere chamber 34. That is, in the present embodiment, the high vacuum chamber 33 and the hydrogen atmosphere chamber 34 are separately provided, and although not shown in the figure, the chambers 33 and 34 are provided with a high vacuum exhaust system and a low vacuum exhaust system as those shown in FIG. 1. Also although not shown in the figure, each of the chambers 33 and 34 is provided with a wafer holding part, a radiation pyrometer, a high vacuum exhaust system, a low vacuum exhaust system, a heating lamp, and so forth, as those shown in FIG. 1.

In the present embodiment, the thermal cleaning for removing an oxide film and the epitaxial growth are carried out in the high vacuum chamber 33, and the thermal cleaning for removing contamination is carried out in the low vacuum chamber 34.

In addition, for the high vacuum chamber 33, it is necessary to take measures to maintain the inside thereof at a high vacuum, for example, to provide not only the exhaust system but also the chamber itself with a metal seal construction. However, the low vacuum chamber 34 does not require such measures. The configuration of a crystal growing apparatus as that of the present embodiment is advantageous in cases where the treatment to be performed after the thermal cleaning of the wafer is carried out using an LP-CVD method. This is because, as shown in the timing charts of FIGS. 2(a) to 2(c), after the thermal cleaning under a hydrogen atmosphere, a treatment such as a crystal growth process is carried out. In other words, it is possible to carry out the thermal cleaning under a hydrogen atmosphere using a chamber for carrying out the crystal growth process according to an LP-CVP method.

Moreover, since the high vacuum chamber 33 does not particularly have to be provided with a gas supplying mechanism, the configuration can be simplified in comparison with general-purpose UHV-CVD apparatuses. Recent single wafer LP-CVD apparatuses are, in many cases, designed such that a plurality of chambers can be connected from the start, so the configuration of the crystal growing apparatus of the present embodiment is easily attained.

Next, the procedure of carrying out the removal of the oxide film and the thermal cleaning for removing contamination according to the present embodiment is explained below. In the following description, timings, temperatures, and hydrogen flow rates in the respective treatments are basically the same as those shown in FIGS. 2(a) to 2(b) of Embodiment 1 and therefore further description will be omitted.

First, after a wafer is wet-cleaned and dried in a similar manner to that of Embodiment 1, the wafer is transported into the load lock 30, and subsequently, the wafer is transported into the high vacuum chamber 33 via the transfer chamber 32. The high vacuum chamber 33 is evacuated until the vacuum reaches about $10^{-6}$ to $10^{-8}$ Pa ($10^{-6}$ to $10^{-8}$ Torr), and when the vacuum is sufficiently high, the high vacuum chamber 33 is maintained in a high vacuum condition and heating of the wafer is started. The wafer temperature and the treatment duration are the same as those in Embodiment 1. When the removal of an oxide film by the thermal cleaning under a high vacuum atmosphere has been completed, transport of the wafer is carried out for the thermal cleaning under a hydrogen atmosphere. At this time, when using a transport apparatus that is capable of transporting a wafer while the wafer temperature is kept high, the wafer may be taken out from the high vacuum chamber 33 to the transfer chamber 32 while the temperature is kept high. Alternatively, if the wafer temperature is too high for wafer transportation, the wafer is cooled to an appropriate temperature, and when the transportation becomes possible, the wafer is taken out to the transfer chamber 32. Thereafter, the wafer that has been taken out to the transfer chamber 32 is moved to the low vacuum chamber 34, then the gate valve 44 is closed, and introduction of hydrogen into the low vacuum chamber 34 and heating of the wafer are started. The treatment temperatures, pressures, and hydrogen flow rates of the thermal cleaning under hydrogen atmosphere are the same as those in Embodiment 1. For example, by carrying out a thermal cleaning under a hydrogen atmosphere at 10 Torr (about 1330 Pa) at 770° C. for 5 minutes, carbon on the wafer surface can be effectively reduced.

An advantage of carrying out the thermal cleaning for removing an oxide film under a high vacuum atmosphere and the thermal cleaning for removing contamination under a hydrogen atmosphere in separate chambers as in the present embodiment is that while the wafer is being subjected to the thermal cleaning for an oxide film removal treatment in the high vacuum chamber 33, another wafer (a wafer for which the oxide film removal has been completed) can be simultaneously subjected to the thermal cleaning for a contamination removal treatment in the low vacuum chamber 34. By carrying out two types of thermal cleanings simultaneously, the total time required for treating a plurality of wafers is reduced, and consequently the productivity is improved.

In the foregoing, embodiments of the present invention have been described taking a wafer cleaning prior to an epitaxial growth process as an example, but the thermal cleaning method for the present invention is also applicable to a wafer cleaning prior to other processes, for example, prior to carrying out thermal oxidation for the purpose of forming a clean oxide film on the surface of a semiconductor layer, such as a silicon layer on a wafer.

Embodiment 3

In the following, an example is described in which the present invention is applied to a manufacturing process for a BiCMOS device, in which a bipolar transistor having a Si/SiGe (or Si/SiGeC) heterojunction (referred to as "HBT" below) and a CMOS device having an NMOSFET and a PMOSFET are provided on a common silicon substrate.

Figure 9:
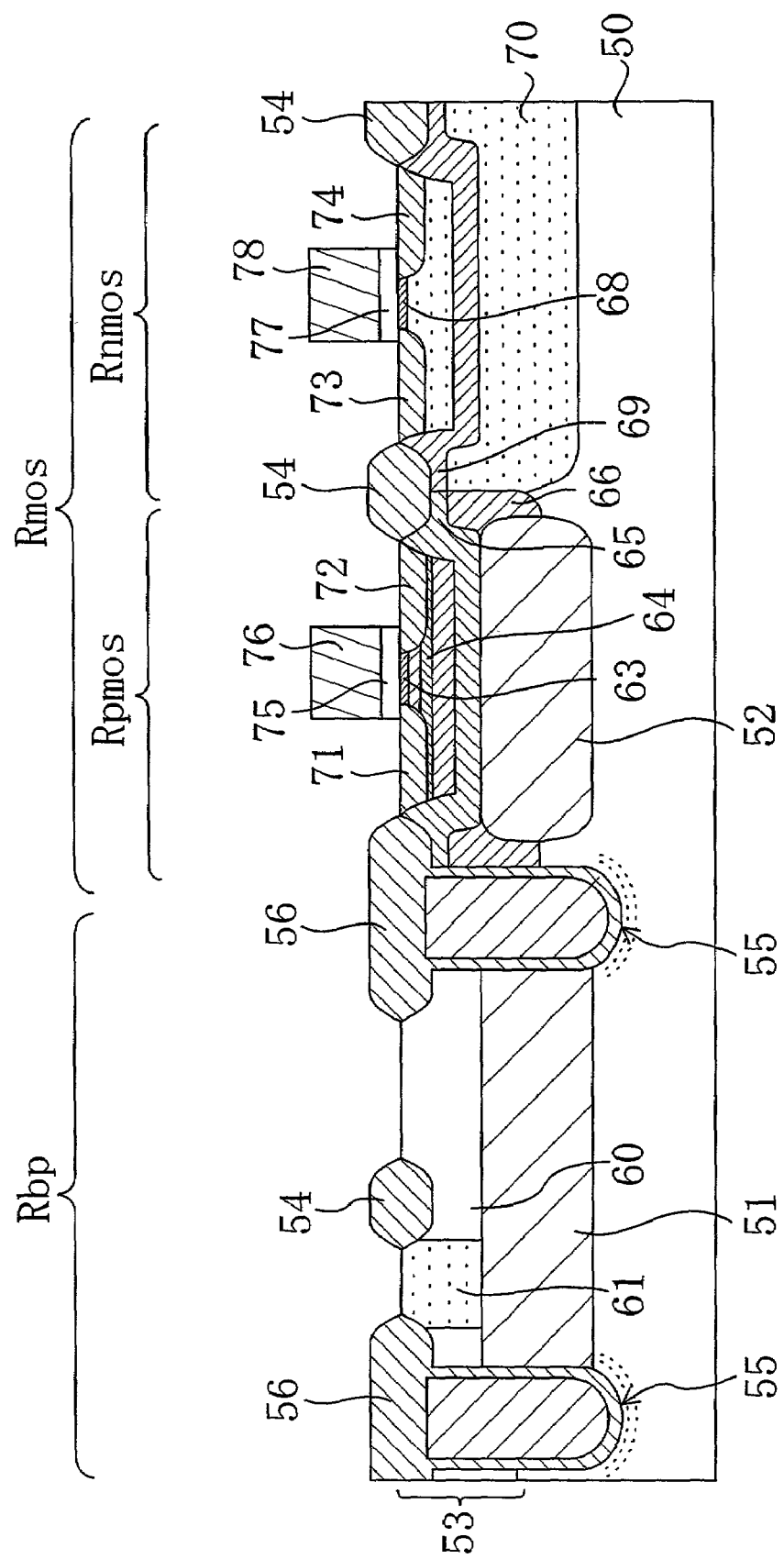
FIG. 9 is a cross-sectional diagram showing, of the manufacturing steps for a BiCMOS device according to Embodiment 3, a state where the source- and drain diffusing layers of MOSFETs have been formed.

FIG. 9 is a cross-sectional diagram of the BiCMOS device showing the construction thereof at a step of the manufacturing steps for a BiCMOS device, at which the formation of an impurity diffused layer of the CMOS device on the substrate is finished. As shown in the figure, a bipolar transistor region Rbp and a MOS transistor formation region Rmos on a silicon substrate 50 have N-type buried layers 51 and 52, respectively, formed therein. The bipolar transistor formation region Rbp is provided with an epitaxial layer 53 made of a Si single crystal. In addition, a separating oxide film 54, a trench separating insulating film 55 composed of buried polysilicon and an underlying oxide film, and a cap oxide film 56 are also formed.

A collector diffusion layer 60 containing impurities and a collector wall 61 are formed in the bipolar transistor formation region Rbp. A PMOSFET formation region Rpmos in the MOS transistor formation region Rmos is provided with a threshold value controlling layer 63, a punchthrough stopper layer 64, a channel stopper layer 65, and an N-type well layer 66. A threshold value controlling layer 68, a channel stopper layer 69, and a P-type well layer 70 are formed in an NMOSFET formation region Rnmos. A P-type source diffusion layer 71, a P-type drain diffusion layer 72, a gate oxide film 75, and a gate electrode 76 are formed in the PMOSFET formation region Rpmos, and an N-type source diffusion layer 73, an N-type drain diffusion layer 74, a gate oxide film 77, and a gate electrode 78 are formed in the NMOSFET formation region Rnmos.

Figure 10:
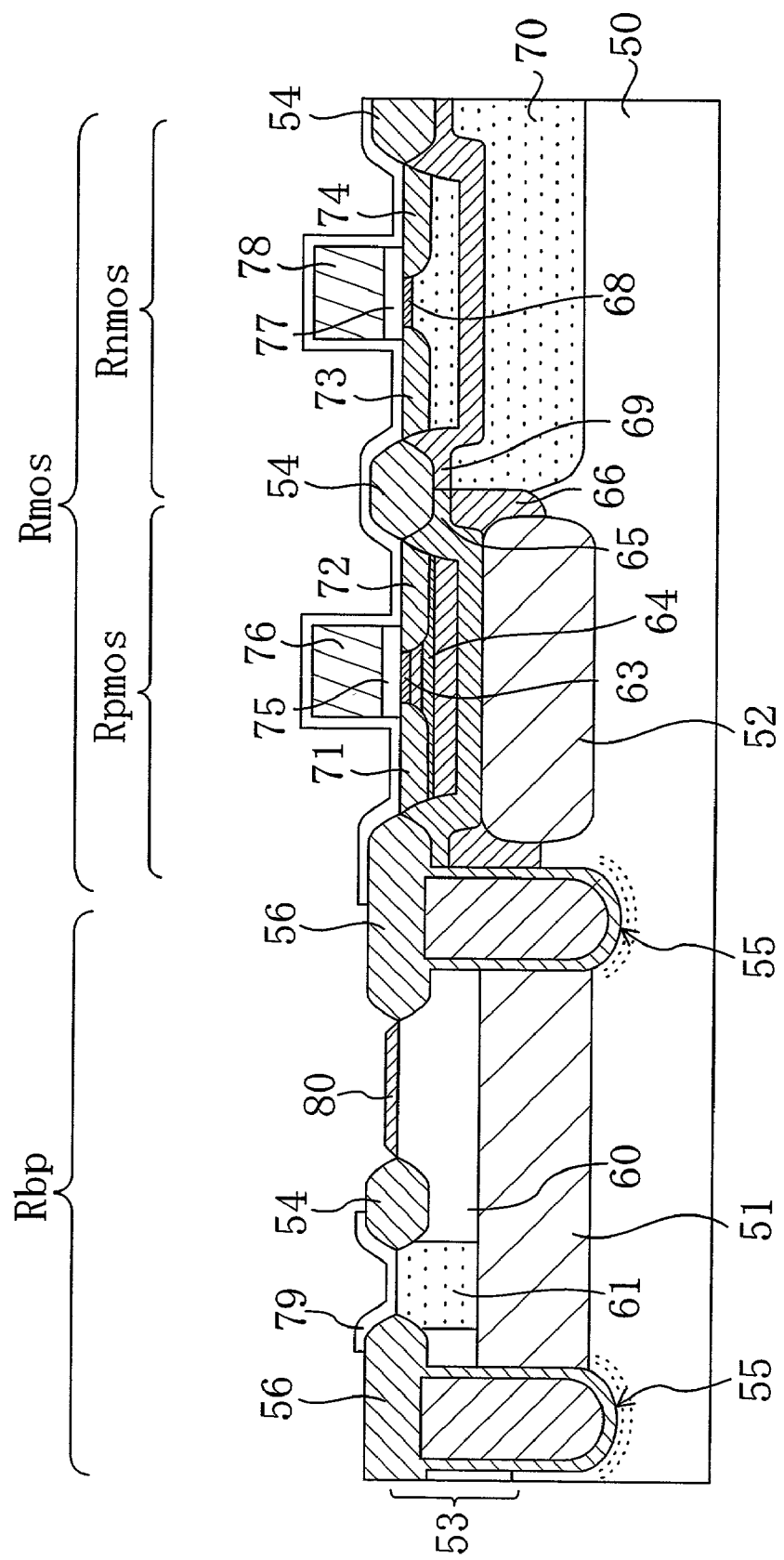
FIG. 10 is a cross-sectional diagram showing, of the steps of manufacturing the BiCMOS device according to Embodiment 3, a state where the SiGe layer of the bipolar transistor has been formed.

In the present embodiment, at the step illustrated in FIG. 10, after a passivation oxide film 79 has been formed over the substrate, the portion of the passivation oxide film 79 that is located above the collector diffusion layer 60 is removed. Then, on the collector diffusion layer 60, a SiGe layer (or a SiGeC layer) 80 is epitaxially grown. It should be noted that the topmost portion of the SiGe layer (or the SiGeC layer) is a Si single crystal layer having a thickness of about 10 nm.

Then, the passivation oxide film 79 is patterned using a photoresist mask, and subsequently, after carrying out the removal of the photoresist mask for example by ashing, and after wet cleaning or the like, the thermal cleaning according to the foregoing Embodiment 1 or 2 is performed. This treatment is a characteristic feature of the present embodiment.

Figure 11:
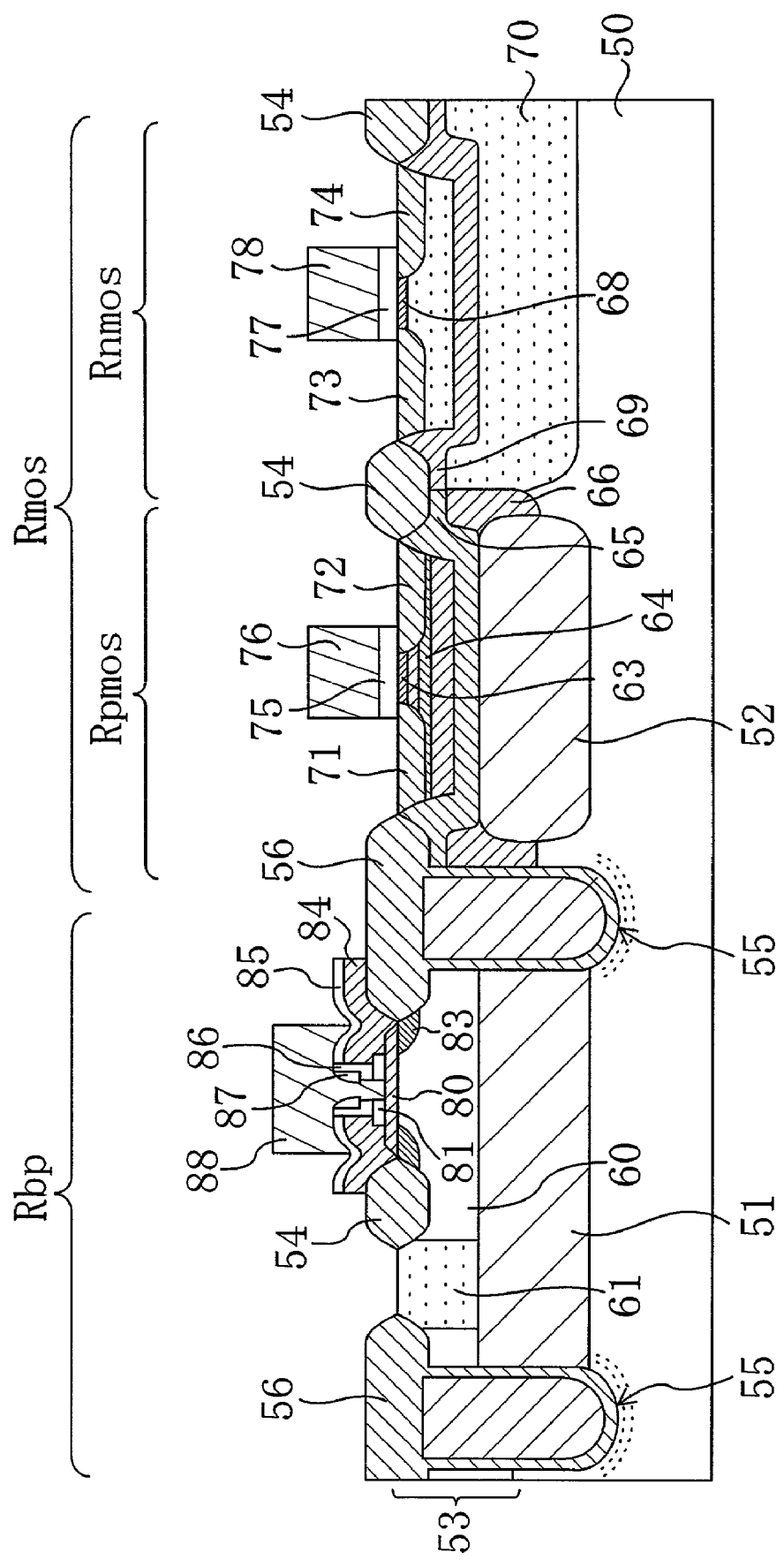
FIG. 11 is a cross-sectional diagram showing, of the steps of manufacturing the BiCMOS device according to Embodiment 3, a state where the SiGe layer of the bipolar transistor has been formed.

Thereafter, as shown in FIG. 11, in the bipolar transistor formation region Rbp, the formation of a base opening regulating oxide film 81, the formation of a polysilicon layer 84 for a base extraction electrode, the formation of an insulating oxide film 86, the formation of a sidewall 87, and the formation of a polysilicon emitter electrode 88 are performed.

According to the present embodiment, in the MOSFET formation region Rmos, the impurity diffusion layers of the PMOSFET and the NMOSFET have already been formed at the step shown in FIG. 9. The reason is that if the formation of the SiGe layer by epitaxial growth in the bipolar transistor formation region Rbp is carried out first, the SiGe layer (or the SiGeC layer), which has relatively poor heat resistance, is adversely affected by a heat treatment process or the like for the MOSFET formation region Rmos. However, if the thermal cleaning is carried out subsequently as a pretreatment for forming the SiGe layer (or the SiGeC layer), the impurity concentration profile of the impurity diffusion layer that has already been formed in the MOSFET formation region Rmos is not degraded so much as to become a problem for practical use, as previously described. Thus, remarkable advantageous effects are exhibited by applying the present invention to a process for a BiCMOS device incorporating a Si/SiGe (or SiGeC) heterobipolar transistor.

Although there are many variations in the configuration of the heterobipolar transistor that is provided in the bipolar transistor formation region Rbp, all cases necessitate a step of epitaxially growing a SiGe layer on a Si layer. Therefore, the present invention is applicable to manufacturing processes for BiCMOSs that incorporate Si/SiGe (or SiGeC) heterobipolar transistors having configurations other than the configuration specified in the present embodiment.

INDUSTRIAL APPLICABILITY

The methods of cleaning a substrate and of manufacturing a semiconductor device according to the present invention can be applied to the manufacture of various kinds of transistors that are incorporated in electronic devices.

The invention claimed is:

1. A method for cleaning a substrate, comprising the steps of:
   a step (a) of heating a substrate in a vacuum atmosphere at a temperature between 600° C. and 800° C. for a given time, and
   a step (b) of subsequently heating the substrate in a hydrogen atmosphere for a given time after the step (a) is completed.

2. The method for cleaning a substrate according to claim 1,
   wherein the step (a) is carried out under an ultrahigh vacuum atmosphere in which pressure is lower than $1\times10^{-5}$ Pa.

3. The method for cleaning a substrate according to claim 1 or 2,
   wherein the step (b) is carried out at a temperature in a range from 750° C. to 800° C.

4. The method for cleaning a substrate according to any one of claims 1 to 2,
   wherein the step (b) is carried out under conditions in which the highest temperature is in a range from 800° C. to 900° C., and the time during which the highest temperature is maintained is 30 seconds or less.

5. The method for cleaning a substrate according to any one of claims 1 to 2,
   wherein the substrate is a silicon substrate.

6. The method for cleaning a substrate according to any one of claims 1 to 2,
   wherein the steps (a) and (b) are carried out as a pretreatment prior to a process of epitaxially growing a crystal layer on the substrate from which an oxide film is removed.

7. The method for cleaning a substrate according to any one of claims 1 to 2,
   wherein the steps (a) and (b) are carried out as a pretreatment prior to a process of forming a thermally-oxidized film over the substrate from which an oxide film is removed.

8. The method for cleaning a substrate according to any one of claims 1 to 2,
   wherein the steps (a) and (b) are carried out on a substrate on which an impurity diffusion layer is formed.

9. A method for producing a semiconductor device, including a process of epitaxially growing a second semiconductor layer on a first semiconductor layer of a substrate, the method comprising the steps of:
   a step (a) of putting the substrate in a vacuum atmosphere for a given time to remove oxide, after the formation of the first semiconductor layer and before the formation of the second semiconductor layer, and
   a step (b) of heating the substrate in a hydrogen atmosphere for a given time, after (a) is completed.

10. The method for producing a semiconductor device according to claim 9, wherein:
    the semiconductor device comprises an MIS device and a Si/SiGe heterobipolar transistor provided on the substrate; and
    the steps (a) and (b) are carried out after a process of forming a diffusion layer of the MIS device and before a process of epitaxially growing a SiGe layer of the Si/SiGe heterobipolar transistor.

11. The method for producing a semiconductor device according to claim 9 or 10, wherein the step (a) and the step (b) are carried out in separate chambers.

* * * * *

UNITED STATES PATENT AND TRADEMARK OFFICE
CERTIFICATE OF CORRECTION

PATENT NO. : 7,105,449 B1 Page 1 of 1
APPLICATION NO. : 10/111599
DATED : September 12, 2006
INVENTOR(S) : Katsuya Nozawa et al.

It is certified that error appears in the above-identified patent and that said Letters Patent is hereby corrected as shown below:

On the title page of the Letters Patent,

Under section "(75) Inventors:", change:

" Minoru Kubo, Nabari (JP) " to -- Minoru Kubo, Mie (JP)--,
" Tohru Saitoh, Settsu (JP) " to -- Tohru Saitoh, Osaka (JP) --

Signed and Sealed this

First Day of May, 2007

JON W. DUDAS
*Director of the United States Patent and Trademark Office*